(12) United States Patent
Kuo et al.

(10) Patent No.: US 9,286,970 B2
(45) Date of Patent: Mar. 15, 2016

(54) MEMORY CIRCUIT FOR PRE-CHARGING AND WRITE DRIVING

(71) Applicant: Taiwan Semiconductor Manufacturing Company, Ltd., Hsin-Chu (TW)

(72) Inventors: Ming-Zhang Kuo, Qionglin Township (TW); Cheng-Chung Lin, Hsin-Chu (TW); Ho-Chieh Hsieh, Hsin-Chu (TW); Kuo Feng Tseng, Taipei (TW); Sang Hoo Dhong, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/326,124

(22) Filed: Jul. 8, 2014

(65) Prior Publication Data

US 2016/0012881 A1 Jan. 14, 2016

(51) Int. Cl.
| | |
|---|---|
| *G11C 11/417* | (2006.01) |
| *G11C 5/02* | (2006.01) |
| *G11C 11/4076* | (2006.01) |
| *G11C 5/06* | (2006.01) |
| *G11C 7/00* | (2006.01) |
| *G11C 7/08* | (2006.01) |
| *G11C 11/419* | (2006.01) |
| *G11C 5/14* | (2006.01) |
| *G11C 11/4094* | (2006.01) |
| *G11C 7/12* | (2006.01) |

(52) U.S. Cl.
CPC .............. *G11C 11/419* (2013.01); *G11C 5/148* (2013.01); *G11C 5/025* (2013.01); *G11C 5/06* (2013.01); *G11C 7/08* (2013.01); *G11C 7/12* (2013.01); *G11C 11/4076* (2013.01); *G11C 11/4094* (2013.01); *G11C 11/417* (2013.01)

(58) Field of Classification Search
CPC ........ G11C 11/417; G11C 7/12; G11C 5/025; G11C 11/4076; G11C 5/06; G11C 11/4094; G11C 7/08
USPC ..................... 365/154, 155, 156, 189.11, 203
See application file for complete search history.

(56) References Cited

U.S. PATENT DOCUMENTS

| | | | | |
|---|---|---|---|---|
| 5,297,090 | A  * | 3/1994 | McClure ..................... 365/203 |
| 5,633,605 | A  * | 5/1997 | Zimmerman et al. ......... 326/86 |
| 5,959,916 | A  * | 9/1999 | Kumar ......................... 365/203 |
| 7,388,774 | B1 * | 6/2008 | Kim ............................. 365/154 |
| 8,351,287 | B1 * | 1/2013 | Sood et al. ................... 365/203 |
| 2010/0054011 | A1 * | 3/2010 | Kim ......................... 365/49.17 |
| 2010/0091581 | A1 * | 4/2010 | Van Winkelhoff et al. ......................... 365/189.05 |

FOREIGN PATENT DOCUMENTS

JP 05128862 A * 5/1993

* cited by examiner

*Primary Examiner* — Ly D Pham
(74) *Attorney, Agent, or Firm* — Slater & Matsil, L.L.P.

(57) ABSTRACT

A memory includes a word line, a bit line and a complementary bit line. A memory cell has a data node coupled to the bit line and a complementary data node coupled to the complementary bit line. The word line controls access to the memory cell. A circuit is coupled to the bit line and the complementary bit line. The circuit is configured to pull up to a high voltage, pull down to a low voltage, or float the bit line and the complementary bit line based on a first timing of pre-charging and a second timing of write driving. The first timing and the second timing are synchronized.

17 Claims, 4 Drawing Sheets

| TP | SEG=1* | SEG=0 | CP | SEG=1 | SEG=0 |
|---|---|---|---|---|---|
| PWRDN** | VDD | VDD | PWRDN | VDD | VDD |
| READ | VDD | VSS | READ | VDD | VSS |
| W1 | VSS | VSS | W1 | VDD | VSS |
| W0 | VDD | VSS | W0 | VSS | VSS |
| TN | SEG=1 | SEG=0 | CN | SEG=1 | SEG=0 |
| PWRDN | VSS | VSS | PWRDN | VSS | VSS |
| READ | VSS | VSS | READ | VSS | VSS |
| W1 | VSS | VSS | W1 | VDD | VSS |
| W0 | VDD | VSS | W0 | VSS | VSS |

MEMORY CIRCUIT FOR PRE-CHARGING AND WRITE DRIVING

BACKGROUND

Static random access memory (SRAM) is a type of volatile semiconductor memory that stores data bits using bi-stable circuitry. Bi-stable circuitry will maintain the integrity of a stored bit without refreshing. A single SRAM cell is referred to as a memory cell because the single SRAM cell stores one bit of information, represented by a logic state of two cross coupled inverters. SRAM are commonly used in integrated circuits. Embedded SRAM is popular in high speed communication, image processing and system-on-chip (SOC) applications.

Memory arrays include multiple memory cells arranged in rows and columns. In some approaches, each memory cell in a memory array includes a connection to a power supply voltage and a connection to a reference voltage. Logic signals on bit lines control reading from and writing to a memory cell. A word line controls connections of the bit lines to the cross-coupled inverters through pass gates. When the pass gates are in a non-conductive state, the memory cell floats.

As timing and voltage margins are reduced for SRAM, the timing control signal sequence of pre-charge and write driver are difficult to accurately control. If the timing of the pre-charge and write driver are not well coordinated, unnecessary power consumption or a slow writing operation may occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
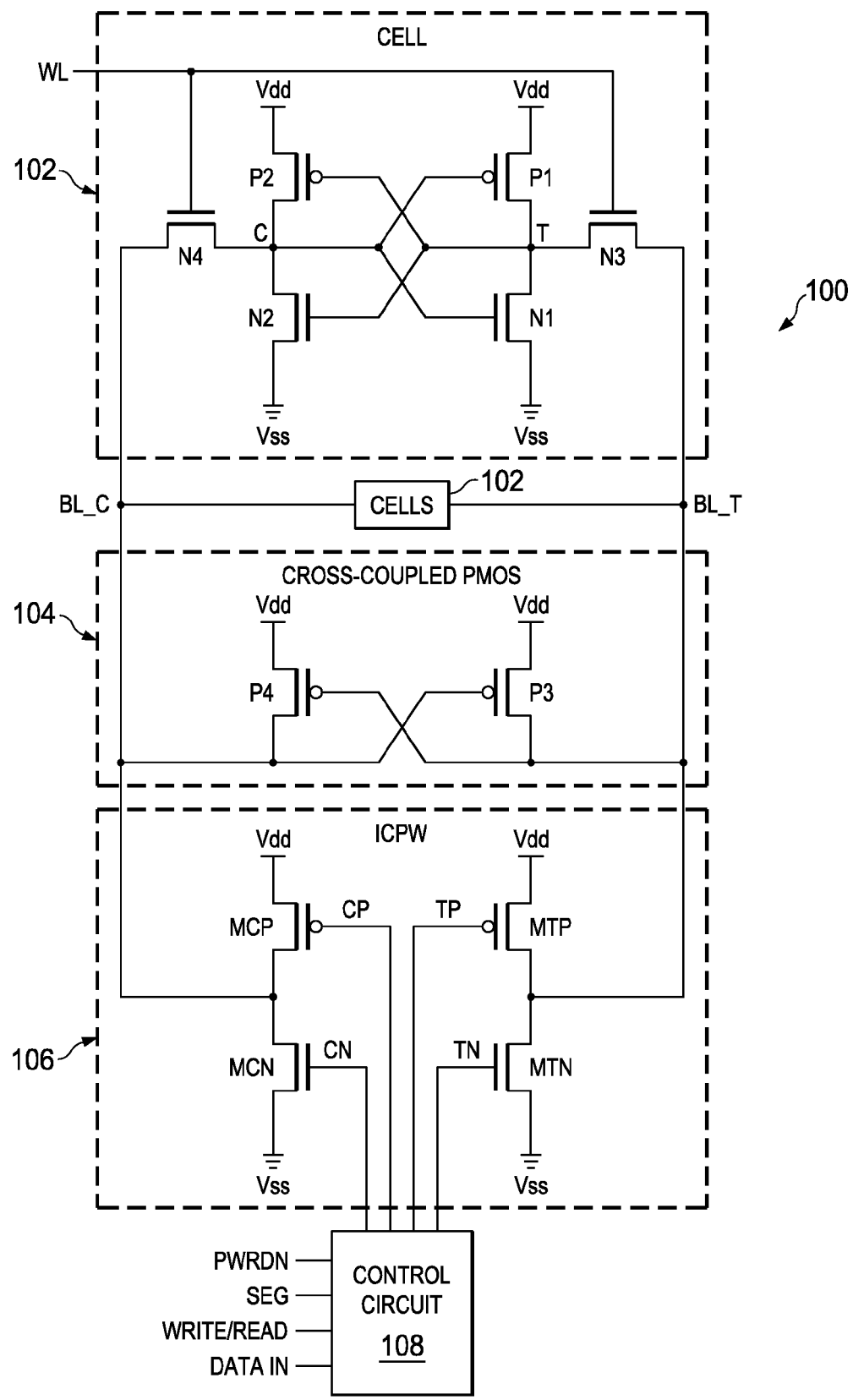
FIG. 1 illustrates a SRAM array having an independently controlled pre-charger and write driver (ICPW) circuit according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In a memory design, the timing control of pre-charge and write driver is one of many important issues. Memory operation timing and/or power consumption can be impacted with an inappropriate design. A new pre-charge and write driver scheme is proposed to improve write speed and prevent the unnecessary power consumption due to inappropriate timing control.

FIG. 1 illustrates a SRAM array 100 having an independently controlled pre-charger and write driver (ICPW) circuit 106 according to some embodiments. The SRAM array 100 includes multiple memory cells 102 arranged in rows and columns. In FIG. 1, memory cells 102 in a column sharing bit lines BL_T and BL_C are shown. However, a person skilled in the art will understand that there are many columns in the SRAM array 100.

The bit lines BL_T and BL_C are shown. BL_T is referred to a true bit line (or bit line) and BL_C is referred to a complementary bit line. Each memory cell 102 in the SRAM array 100 includes a connection to a high power supply voltage (Vdd or VDD) and a connection to a low power supply voltage (Vss, VSS, or ground). Logic signals on bit lines BL_T and BL_C control reading from and writing to the memory cell 102. A word line WL controls access to the memory cell 102 by controlling connections of the bit lines BL_T and BL_C to the memory cell 102.

Each memory cell 102 has 6 transistors (6T) in FIG. 1, including PMOS transistors P1 and P2, NMOS transistors N1, N2, N3, and N4. PMOS transistor P1 and NMOS transistor N1, PMOS transistor P2 and NMOS transistor N2 form cross-coupled inverters coupled to bit lines BL_T and BL_C through pass gate NMOS transistors N3 and N4. In other embodiments, the memory cell 102 may have different numbers of transistors, such as 8T, 10T, etc.

A data node T stores a logic value (logic 1/logic high or logic 0/logic low), and a complementary data node C stores a complementary logic value (logic 0/logic low or logic 1/logic high). The data node T is coupled to the bit line BL_T through the pass gate N3, and the complementary data node C is coupled to the complementary bit line BL_C through the pass gate N4. When the pass gates N3 and N4 are in a non-conductive state, the memory cell 102 floats with the data stored on data nodes T and C retaining its values. Access to the memory cell 102 is enabled by the word line WL. The word line WL is coupled to the gates of the NMOS transistors (pass gates) N3 and N4. These pass gates N3 and N4 control whether the memory cell 102 will be connected to the bit lines BL_T and BL_C.

Cross-coupled PMOS transistors P3 and P4 are coupled to the bit-lines BL_T and BL_C as a keeper circuit 104 in some embodiments. In a read logic 1 operation, the keeper circuit 104 holds BL_T at the high voltage against the leakage current from memory cells 102 and noise coupling. In a write operation, the keeper circuit 104 provides pull-high capability as one of the bit line (BL_T or BL_C) is pulled down by a write driver according to the write data.

For a read/write operation, a read/write cycle is started by pre-charging both the bit lines BL_T and BL_C to a logic 1 or logic high (to the high voltage). For a read operation, the memory cell 102 is assumed to store a logic 1 value at the data node T and a logic 0 at the complementary data node C as an example. Asserting the word line WL enables both pass gates N3 and N4. Then the stored values at the data node T and C are transferred to the bit lines BL_T and BL_C respectively by leaving BL_T at its pre-charged value (high voltage) and discharging the complementary bit line BL_C through the pass gate N4 to a logic 0/logic low (the low voltage $V_{ss}$). The pass gate N3 connects the bit line BL_T to the logic 1/logic high (the high voltage $V_{dd}$) value at data node T (less a threshold voltage), and P3 of keeper circuit 104 keeps the bit line BL_T at the logic high value.

If the memory cell 102 contains a logic 0 at the data node T and a logic 1 at the complementary data node C, the complementary bit line BL_C is kept at logic 1 and the bit line BL_T is pulled down toward a logic 0. Then a sense amplifier (not shown) will sense a voltage difference between the bit line BL_T and the complementary bit lint BL_C, and determine which bit line has a higher voltage to determine the read data value. The sense amplifier thus determines whether a logic 1 or a logic 0 was stored in the memory cell 102.

For a write operation, the memory cell 102 is assumed to store a logic 0 and a logic 1 is being written to the memory cell 102 as an example. For the write operation, a write driver pulls up the bit line BL_T to a logic 1 and the complementary bit line BL_C is pulled down to a logic 0. Then asserting the word line WL enables both pass gates N3 and N4, and the logic values of the bit lines BL_T and BL_C are transferred to the data nodes T and C respectively.

If the activation timing of the write driver is delayed from the completion time of pre-charging (and turning off the pre-charging), then the high voltage of the previously pre-charged bit line BL_T may drop towards the low voltage with the activation of word line WL until the activation of the write driver. The magnitude of this voltage drop depends on the bit line loading (e.g., capacitance), making a cell write time longer, since the bit line BL_T should be pulled up again. This results in a slower write speed of the memory cell 102. The impact on the writing time delay of the memory cell 102 increases even more, if the voltage drop is large enough to activate the cross-coupled PMOS transistor P3 or P4 (depending upon the particular configuration and levels of the bit lines) of the keeper circuit 104.

If the activation timing of the write driver is before the completion timing of pre-charging (and turning off the pre-charging), then the pre-charging circuit and the write driver circuit form a short circuit, which results in unnecessary power consumption.

To avoid such problems as described above, an independently controlled pre-charger and write driver (ICPW) circuit 106 is coupled to the bit lines BL_T and BL_C. In some embodiments, the ICPW circuit 106 includes a first PMOS transistor MTP coupled between a high voltage node Vdd and the bit line BL_T, and a second PMOS transistor MCP coupled between the high voltage node Vdd and the complementary bit line BL_C. A first NMOS transistor MTN is coupled between a low voltage node Vss and the bit line BL_T, and a second NMOS transistor MCN is coupled between the low voltage node Vss and the complementary bit line BL_C.

The ICPW circuit 106 pulls up to a high voltage Vdd, pulls down to a low voltage Vss, or floats the bit line BL_T and the complementary bit line BL_C based on a first timing of pre-charging and a second timing of write driving, and the first timing and the second timing are synchronized. A control circuit 108 is coupled to the ICPW circuit 106 to control the operation of the ICPW circuit 106. The control circuit 108 receives input signals PWRDN (power down mode signal), SEG (memory segment including the memory cell 102 selection signal), WRITE/READ (write/read operation signal), and DATA IN (write data signal). The control circuit 108 provides control signals TP, CP, TN, CN to the gates of the PMOS transistors MTP and MCP, and the NMOS transistors MTN and MCN, respectively. The operation ICPW circuit 106 is described in more detail below.

Figures 2, 4:
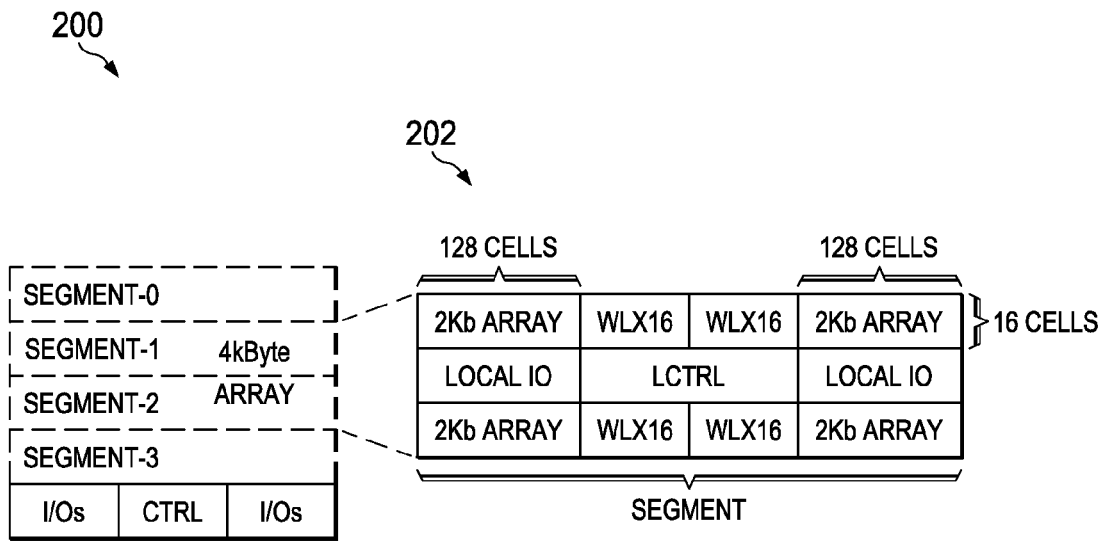
FIG. 2 illustrates an exemplary memory segment layout for the SRAM array of FIG. 1 according to some embodiments.
FIG. 4 shows a table of control signal voltage values of the ICPW circuit corresponding to various operation modes of FIG. 3 according to some embodiments.

Regarding the SEG signal, an exemplary memory layout 200 for the SRAM array 100 of FIG. 1 is shown in FIG. 2. The memory layout 200 is a 4 kByte memory array divided into four segments: Segment-0, Segment-1, Segment-2, and Segment-3. The memory layout 200 also includes a control circuit area CTRL and input/output circuit areas I/Os. One exemplary section 202 includes four 2 kb arrays, each 2 kb arrays including 128×16 memory cells and coupled with 16 word line drivers WLX16, local control circuit area LCTRL, local input/output areas Local IOs. When the memory cell 102 in a given memory section is selected, the SEG signal for the selected section is enabled (e.g., SEG=1, which means a logic 1/logic high).

Figure 3:
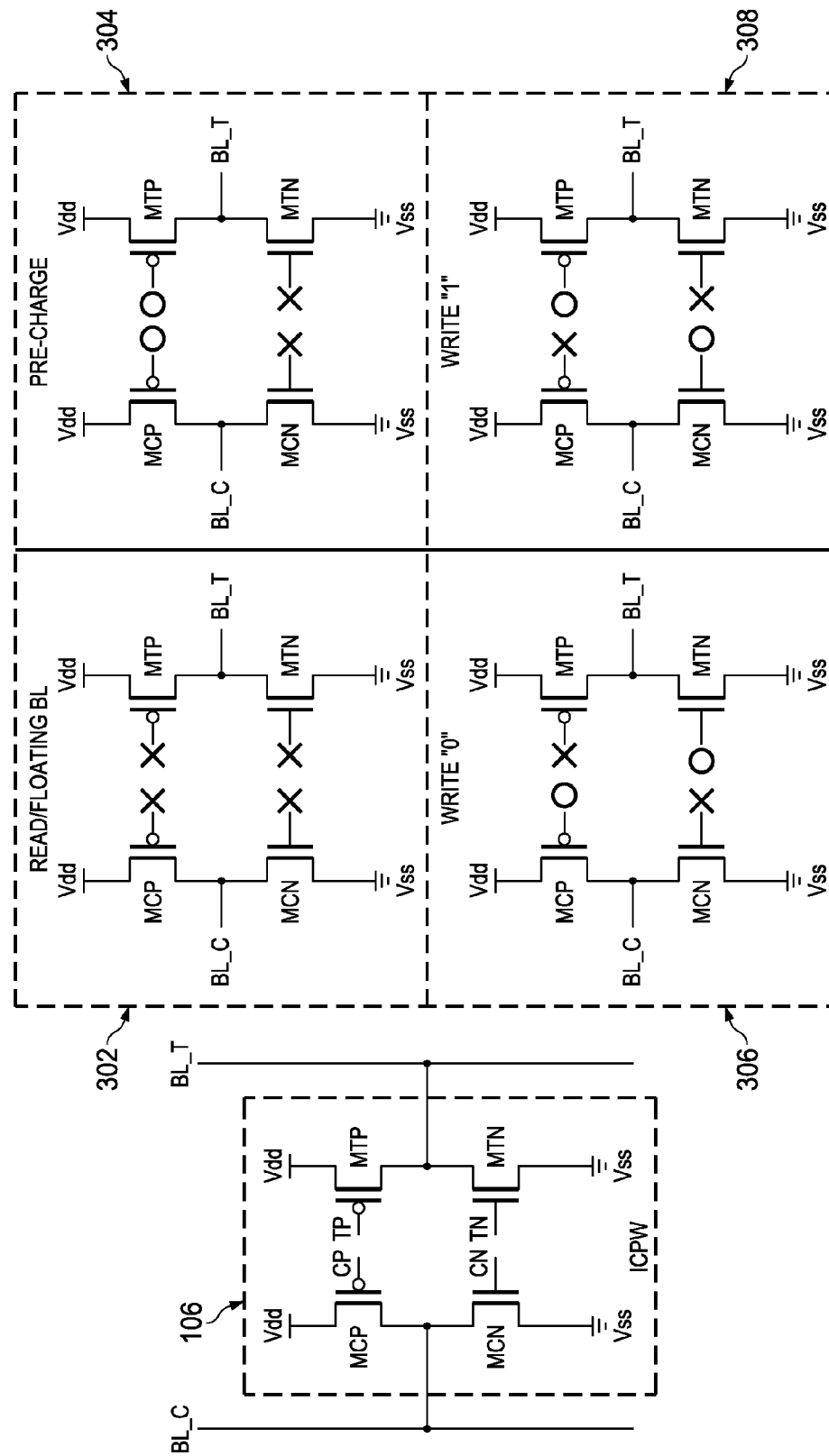
FIG. 3 illustrates various operation modes of the ICPW circuit for the SRAM array in FIG. 1 according to some embodiments.

FIG. 3 illustrates various operation modes of the ICPW circuit 106 for the SRAM array in FIG. 1 according to some embodiments. The control signals TP, CP, TN, CN are provided by the control circuit 108 according to the various operation modes of the memory cell 102. For a read operation or floating bit line (power down) mode 302, the PMOS transistors MTP and MCP, and the NMOS transistors MTN and MCN are turned off. The control signals TP, CP, TN, and CN are provided accordingly. Thus, TP=CP=1 (high logic/voltage), and TN=CN=0 (low logic/voltage).

For a pre-charge operation mode 304, the PMOS transistors MTP and MCP, are turned on, and the NMOS transistors MTN and MCN are turned off. The PMOS transistors MTP and MCP pull up the bit lines BL_T and BL_C for the pre-charge operation. The control signals TP, CP, TN, and CN are provided accordingly. Thus, TP=CP=0, and TN=CN=0.

For a write 0 operation mode 306, the write data is a logic 0 and the complementary write data is a logic 1. The PMOS transistor MTP is turned off, and the PMOS transistor MCP is turned on, the NMOS transistor MTN is turned on, and the NMOS transistor MCN is turned off. The PMOS transistor MCP pulls up the complementary bit line BL_C to the high voltage (Vdd), since the complementary write data is a logic 1. The NMOS transistor MTN pulls down the bit line BL_T to the low voltage (Vss), since the write data is a logic 0. The control signals TP, CP, TN, CN are provided accordingly. Thus, TP=1, CP=0, TN=1, and CN=0.

For a write 1 operation mode 308, the write data is a logic 1 and the complementary write data is a logic 0. The PMOS transistor MTP is turned on, and the PMOS transistor MCP is turned off, the NMOS transistor MTN is turned off, and the NMOS transistor MCN is turned on. The PMOS transistor MTP pulls up the bit line BL_T to the high voltage (Vdd), since the write data is a logic 1. The NMOS transistor MCN pulls down the complementary bit line BL_C to the low voltage (Vss), since the complementary write data is a logic 0. The control signals TP, CP, TN, and CN are provided accordingly. Thus, TP=0, CP=1, TN=0, and CN=1.

FIG. 4 shows a table of control signal voltage values of the ICPW circuit corresponding to various operation modes of FIG. 3 according to some embodiments. The voltage values of four control signals TP, CP, TN, CN are given for various operation modes: PWRDN (power down mode), Read (read mode), and W1 (write 1 mode), W0 (write 0 mode). SEG=1 means the memory segment including memory cell 102 is selected and in access mode (read or write), and SEG=0 means the memory segment including memory cell 102 is not selected.

W1=1 when the memory cell 102 is in a write mode and the write data is a logic high. If WRITE/READ=1 for a write operation and DATA IN=1, W1=1 in some embodiments. W0=1 when the memory cell 102 is in a write mode and the write data is a logic low. If WRITE/READ=1 for a write operation and DATA IN=0, W0=1 in some embodiments. If WRITE/READ=0 for a read operation, Read=1 in some embodiments. It is assumed that there are five operation modes: PWRDN, Read, W1, W0, and pre-charge. Thus, if all other modes are not applicable (PWRDN=Read=W1=W0=0), then it means the memory cell 102 is in a pre-charge mode. In some other embodiments, the control signal voltage values in FIG. 4 can be different with different operation mode definitions.

The voltage of the control signal TP is provided according to the following, assuming SEG=1. When the control circuit 108 has PWRDN=1, TP=VDD (TP=1), so that the PMOS transistor MTP is turned off. When the control circuit 108 has Read=1, TP=VDD (TP=1), so that the PMOS transistor MTP is turned off. When the control circuit 108 has W1=1, TP=VSS (TP=0), so that the PMOS transistor MTP is turned on. Thus, the PMOS transistor MTP pulls up the bit line BL_T to the high voltage (VDD). When the control circuit 108 has W0=1, TP=VDD (TP=1), so that the PMOS transistor MTP is turned off.

The voltage of the control signal TP is provided according to the following, assuming SEG=0. When the control circuit 108 has PWRDN=1, TP=VDD (TP=1), so that the PMOS transistor MTP is turned off. When the control circuit 108 has Read=1, TP=VSS (TP=0), so that the PMOS transistor MTP is turned on. When the control circuit 108 has W1=1, TP=VSS (TP=0), so that the PMOS transistor MTP is turned on. When the control circuit 108 has W0=1, TP=VSS (TP=0), so that the PMOS transistor MTP is turned on.

The voltage of the control signal CP is provided according to the following, assuming SEG=1. When the control circuit 108 has PWRDN=1, CP=VDD (CP=1), so that the PMOS transistor MCP is turned off. When the control circuit 108 has Read=1, CP=VDD (CP=1), so that the PMOS transistor MTP is turned off. When the control circuit 108 has W1=1, CP=VDD (CP=0), so that the PMOS transistor MTP is turned off. When the control circuit 108 has W0=1, CP=VSS (CP=1), so that the PMOS transistor MCP is turned on. Thus, the PMOS transistor MCP pulls up the bit line BL_C to the high voltage (VDD).

The voltage of the control signal CP is provided according to the following, assuming SEG=0. When the control circuit 108 has PWRDN=1, CP=VDD (CP=1), so that the PMOS transistor MCP is turned off. When the control circuit 108 has Read=1, CP=VSS (CP=0), so that the PMOS transistor MCP is turned on. When the control circuit 108 has W1=1, CP=VSS (CP=0), so that the PMOS transistor MCP is turned on. When the control circuit 108 has W0=1, CP=VSS (CP=0), so that the PMOS transistor MCP is turned on.

The voltage of the control signal TN is provided according to the following, assuming SEG=1. When the control circuit 108 has PWRDN=1, TN=VSS (TN=0), so that the NMOS transistor MTN is turned off. When the control circuit 108 has Read=1, TN=VSS (TN=0), so that the NMOS transistor MTN is turned off. When the control circuit 108 has W1=1, TN=VSS (TN=0), so that the NMOS transistor MTN is turned off. When the control circuit 108 has W0=1, TN=VDD (TN=1), so that the NMOS transistor MTN is turned on. Thus, the NMOS transistor MTN pulls down the bit line BL_T to the low voltage (VSS).

The voltage of the control signal TN is provided according to the following, assuming SEG=0. When the control circuit 108 has PWRDN=1, TN=VSS (TN=0), so that the NMOS transistor MTN is turned off. When the control circuit 108 has Read=1, TN=VSS (TN=0), so that the NMOS transistor MTN is turned off. When the control circuit 108 has W1=1, TN=VSS (TN=0), so that the NMOS transistor MTN is turned off. When the control circuit 108 has W0=1, TN=VSS (TN=0), so that the NMOS transistor MTN is turned off.

The voltage of the control signal CN is provided according to the following, assuming SEG=1. When the control circuit 108 has PWRDN=1, CN=VSS (CN=0), so that the NMOS transistor MCN is turned off. When the control circuit 108 has Read=1, CN=VSS (CN=0), so that the NMOS transistor MCN is turned off. When the control circuit 108 has W1=1, CN=VDD (CN=1), so that the NMOS transistor MCN is turned on. Thus, the NMOS transistor MCN pulls down the complementary bit line BL_C to the low voltage (VSS). When the control circuit 108 has W0=1, CN=VSS (CN=0), so that the NMOS transistor MCN is turned off.

The voltage of the control signal CN is provided according to the following, assuming SEG=0. When the control circuit 108 has PWRDN=1, CN=VSS (CN=0), so that the NMOS transistor MCN is turned off. When the control circuit 108 has Read=1, CN=VSS (CN=0), so that the NMOS transistor MTN is turned off. When the control circuit 108 has W1=1, CN=VSS (CN=0), so that the NMOS transistor MCN is turned off. When the control circuit 108 has W0=1, CN=VSS (CN=0), so that the NMOS transistor MCN is turned off.

From the table content of FIG. 4, the logic values of the control signals TP, CP, TN, CN can be given by the following logic equations:

$$TP = PWRDN + SEG \cdot (Read + \overline{W0}) \qquad \text{Equation (1)}$$

$$CP = PWRDN + \overline{SEG} \cdot (Read + \overline{W1}) \qquad \text{Equation (2)}$$

$$TN = SEG \cdot W0 \qquad \text{Equation (3)}$$

$$CN = \overline{SEG} \cdot W1 \qquad \text{Equation (4),}$$

where "+" is an OR logic operator, and "·" is an AND logic operator. It is assumed that there are five operation modes: PWRDN, Read, W1, W0, and pre-charge. Thus, if all other modes are not applicable (PWRDN=Read=W1=W0=0), then it means the memory cell 102 is in a pre-charge mode.

For example, from Equation (1), TP=0 with SEG=1, when W1=1 (PWRDN=Read=W0=0) or in a pre-charge mode (PWRDN=Read=W1=W0=0). TP=0 with SEG=0, when PWRDN=0 regardless of Read, W0, and W1. TP=1 when PWRDN=1 regardless of values of SEG, Read, W0, and W1.

From Equation (2), CP=0 with SEG=1, when W0=1 (PWRDN=Read=W1=0) or in a pre-charge mode (PWRDN=Read=W1=W0=0). CP=0 with SEG=0, when PWRDN=0 regardless of Read, W0, and W1. CP=1 when PWRDN=1 regardless of values of SEG, Read, W0, and W1.

From Equation (3), TN=1 when SEG=1 and W0=1. The NMOS transistor MTN is turned on. Thus, the NMOS transistor MTN pulls down the bit line BL_T to the low voltage (VSS), corresponding to the write data of a logic 0.

From Equation (4), CN=1 with SEG=1 and W1=1. Thus, the NMOS transistor MCN pulls down the complementary bit line BL_C to the low voltage (VSS), corresponding to the write data of a logic 1, or the complementary write data of a logic 0.

Figure 5:
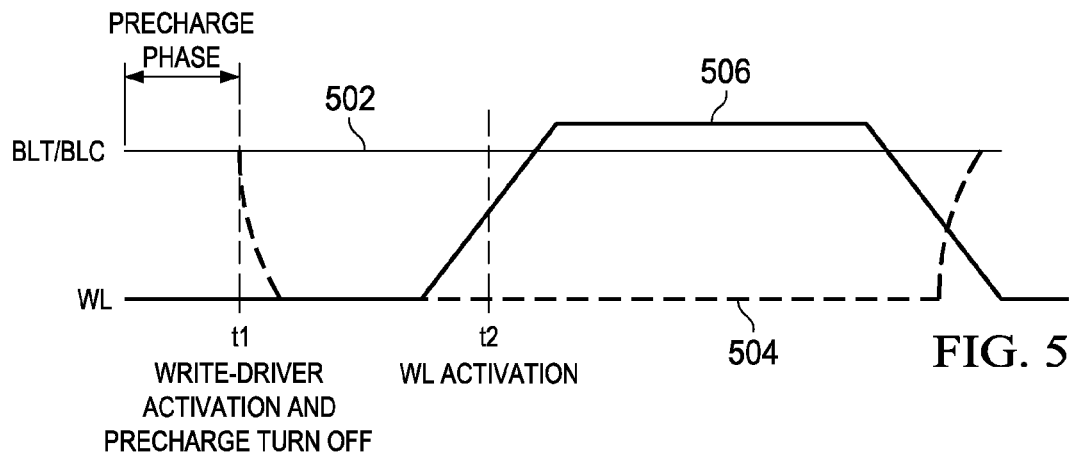
FIG. 5 illustrates a timing diagram of the SRAM array in FIG. 1 according to some embodiments.

FIG. 5 illustrates a timing diagram of the SRAM array in FIG. 1 according to some embodiments. Initially, the bit lines BL_T and BL_C are pre-charged before a read/write operation for the memory cell 102. This corresponds to the pre-charge mode 304 of the ICPW circuit in FIG. 3. The PMOS transistors MTP and MCP, are turned on, and the NMOS transistors MTN and MCN are turned off. The PMOS transistors MTP and MCP pull up the bit lines BL_T and BL_C for the pre-charge operation. The control signals TP, CP, TN, and CN are provided accordingly. Thus, TP=CP=0, and TN=CN=0.

At time t1, the pre-charging operation is finished and a write driving operation is activated to prepare for a write 1 (W1) operation in this example. This corresponds to the write 1 mode 308 in FIG. 3. For the write 1 operation mode 308, the write data is a logic 1 and the complementary write data is a logic 0. The PMOS transistor MTP is turned on, and the PMOS transistor MCP is turned off, the NMOS transistor MTN is turned off, and the NMOS transistor MCN is turned on. The PMOS transistor MTP pulls up the bit line BL_T to the high voltage (Vdd) as shown by the waveform BLT 502, since the write data is a logic 1. The NMOS transistor MCN pulls down the complementary bit line BL_C to the low voltage (Vss) as shown by the waveform BLC 504, since the complementary write data is a logic 0. The control signals TP, CP, TN, and CN are provided accordingly. Thus, TP=0, CP=1, TN=0, and CN=1.

At time t2, the word line WL as shown by the waveform WL 506 is activated to access the memory cell 102 so that the write data can be transferred to the memory cell 102. The pass gates N3 and N4 are turned on and the data node T has a logic 1 from BL_T and the complementary data node C has a logic 0 from BL_C. The write 1 operation is complete.

As described above, the ICPW circuit 106 and control circuit 108 synchronize the timing of pre-charging and the timing of write driving. The ICPW circuit 106 and the control circuit 108 pull up, pull down, or float the bit line BL_T and BL_C according to the pre-charge timing, write driving timing, and the write-in data. The ending of the first timing of pre-charging and starting of the second timing of write driving are performed simultaneously at time t1 in some embodiments. Therefore, the method using the ICPW circuit 106 eliminates the slow write timing issue and unnecessary power consumption from inappropriate timing of pre-charging and write driving described previously.

Figure 6:
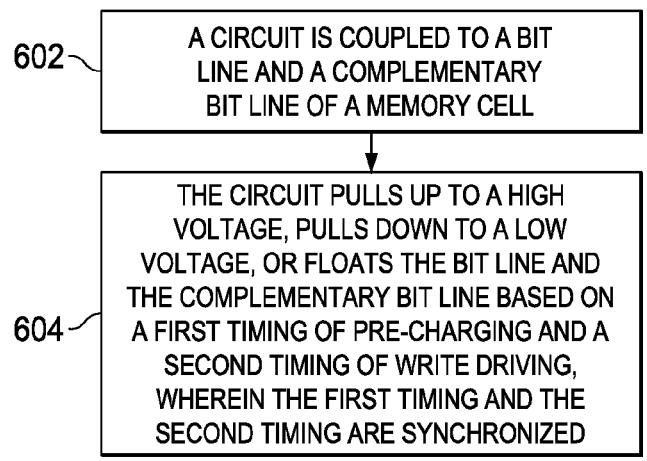
FIG. 6 is a flow diagram illustrating the operation of SRAM array having the ICPW circuit in FIG. 1 according to some embodiments.

FIG. 6 is a flow diagram illustrating the operation of SRAM array having the ICPW circuit in FIG. 1 according to some embodiments. At step 602, a circuit (e.g., ICPW circuit 106) is coupled to a bit line BL_T and a complementary bit line BL_C of a memory cell 102. At step 604, the circuit pulls up to a high voltage, pulls down to a low voltage, or floats the bit line BL_T and the complementary bit line BL_C based on a first timing of pre-charging and a second timing of write driving. The first timing and the second timing are synchronized. In some embodiments, ending the first timing of pre-charging and starting the second timing of write driving is performed simultaneously.

In some embodiments, the circuit turns off a first PMOS transistor MTP of the circuit, a second PMOS transistor MCP of the circuit, a first NMOS transistor MTN of the circuit, and a second NMOS transistor MCN of the circuit to float the bit line BL_T and the complementary bit line BL_C. The memory cell 102 is in a reading operation or in a power down mode in some embodiments. The first PMOS transistor MTP is coupled between a high voltage node Vdd and the bit line BL_T, and the second PMOS transistor MCP is coupled between the high voltage node Vdd and the complementary bit line BL_C. The first NMOS transistor MTN is coupled between a low voltage node Vss and the bit line BL_T. The second NMOS transistor MCN is coupled between the low voltage node Vss and the complementary bit line BL_C.

In some embodiments, when writing a high logic value to a data node T, the circuit turns on the first PMOS transistor MTP of the circuit and the second NMOS transistor MCN of the circuit. The data node T of the memory cell 102 is coupled to the bit line BL_T. A complementary data node C of the memory cell 102 is coupled to the complementary bit line BL_C.

In some embodiments, when writing a low logic value to a data node T, the circuit turns on the second PMOS transistor MCP of the circuit and the first NMOS transistor MTN of the circuit.

In some embodiments, the circuit turns on the first PMOS transistor MTP of the circuit and the second PMOS transistor MCP of the circuit for pre-charging.

According to some embodiments, a memory includes a word line, a bit line and a complementary bit line. A memory cell has a data node coupled to the bit line and a complementary data node coupled to the complementary bit line. The word line controls access to the memory cell. A circuit is coupled to the bit line and the complementary bit line. The circuit is configured to pull up to a high voltage, pull down to a low voltage, or float the bit line and the complementary bit line based on a first timing of pre-charging and a second timing of write driving. The first timing and the second timing are synchronized.

According to some embodiments, a method includes coupling a circuit to a bit line and a complementary bit line of a memory cell. The circuit pulls up to a high voltage, pulls down to a low voltage, or floats the bit line and the complementary bit line based on a first timing of pre-charging and a second timing of write driving. The first timing and the second timing are synchronized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory, comprising:
   a word line;
   a bit line and a complementary bit line;
   a memory cell having a data node coupled to the bit line and a complementary data node coupled to the complementary bit line, wherein the word line controls access to the memory cell; and
   a circuit coupled to the bit line and the complementary bit line, wherein the circuit is configured to pull up to a high voltage, pull down to a low voltage, or float the bit line and the complementary bit line based on a first timing of pre-charging and a second timing of write driving, wherein the first timing and the second timing are synchronized by control signals and further wherein the circuit comprises a first PMOS transistor coupled between a high voltage node and the bit line, a second PMOS transistor coupled between the high voltage node and the complementary bit line, a first NMOS transistor coupled between a low voltage node and the bit line, a second NMOS transistor coupled between the low voltage node and the complementary bit line, and wherein the circuit is configured to turn on the first PMOS transistor and the second PMOS transistor for pre-charging.

2. The memory of claim 1, wherein ending of the first timing of pre-charging and starting of the second timing of write driving are performed simultaneously.

3. The memory of claim 1, wherein the first PMOS transistor and the second NMOS transistor are turned on when writing a high logic value to the data node.

4. The memory of claim 1, wherein the second PMOS transistor and the first NMOS transistor are turned on when writing a low logic value to the data node.

5. The memory of claim 1, wherein the first PMOS transistor, the second PMOS transistor, the first NMOS transistor, and the second NMOS transistor are turned off to float the bit line and the complementary bit line.

6. The memory of claim 5, wherein the memory cell is in a reading operation or in a power down mode.

7. The memory of claim 1, wherein a gate of the first PMOS transistor is coupled to a signal TP, and TP is expressed in a logic equation, wherein "+" is an OR logic operator, "·" is an AND logic operator, "PWRDN" is a power down mode signal that has a high logic value when the memory cell is in a power down mode and a low logic value otherwise, "SEG" has a high logic value when a memory segment including the memory cell is selected and a low logic value otherwise, "Read" has a high logic value when the memory cell is in a read operation and a low logic value otherwise, and "W0" has a high logic value when the memory cell is in a write operation to write a low logic value to the data node and a low logic value otherwise.

8. The memory of claim 1, wherein a gate of the second PMOS transistor is coupled to a signal CP, and CP is expressed in a logic equation, wherein "+" is an OR logic operator, "·" is an AND logic operator, "PWRDN" is a power down mode signal that has a high logic value when the memory cell is in a power down mode and a low logic value otherwise, "SEG" has a high logic value when a memory segment including the memory cell is selected and a low logic value otherwise, "Read" has a high logic value when the memory cell is in a read operation and a low logic value otherwise, and "W1" has a high logic value when the memory cell is in a write operation to write a high logic value to the data node and a low logic value otherwise.

9. The memory of claim 1, wherein a gate of the first NMOS transistor is coupled to a signal TN, and TN is expressed in a logic equation, wherein "·" is an AND logic operator, "SEG" has a high logic value when a memory segment including the memory cell is selected and a low logic value otherwise, and "W0" has a high logic value when the memory cell is in a write operation to write a low logic value to the data node and a low logic value otherwise.

10. The memory of claim 1, wherein a gate of the second NMOS transistor is coupled to a signal CN, and CN is expressed in a logic equation, wherein "·" is an AND logic operator, "SEG" has a high logic value when a memory segment including the memory cell is selected and a low logic value otherwise, and "W1" has a high logic value when the memory cell is in a write operation to write a high logic value to the data node and a low logic value otherwise.

11. A method, comprising:
coupling a circuit to a bit line and a complementary bit line of a memory cell; and
the circuit pulling up to a high voltage, pulling down to a low voltage, or floating the bit line and the complementary bit line based on a first timing of pre-charging and a second timing of write driving, wherein the first timing and the second timing are synchronized, and further the circuit turns turning on a first PMOS transistor of the circuit and a second PMOS transistor of the circuit for pre-charging, wherein the first PMOS transistor is coupled between a high voltage node and the bit line, and the second PMOS transistor is coupled between the high voltage node and the complementary bit line.

12. The method of claim 11, wherein ending the first timing of pre-charging and starting the second timing of write driving is performed simultaneously.

13. The method of claim 11, wherein the circuit turns on a PMOS transistor of the circuit and an NMOS transistor of the circuit when writing a high logic value to a data node, the data node of the memory cell is coupled to the bit line, a complementary data node of the memory cell is coupled to the complementary bit line, the PMOS transistor is coupled between a high voltage node and the bit line, and the NMOS transistor is coupled between a low voltage node and the complementary bit line.

14. The method of claim 11, wherein the circuit turns on a PMOS transistor of the circuit and an NMOS transistor of the circuit when writing a low logic value to a data node, the data node of the memory cell is coupled to the bit line, a complementary data node of the memory cell is coupled to the complementary bit line, the PMOS transistor is coupled between a high voltage node and the complementary bit line, and the NMOS transistor is coupled between a low voltage node and the bit line.

15. The method of claim 11, wherein the circuit turns off a first PMOS transistor of the circuit, a second PMOS transistor of the circuit, a first NMOS transistor of the circuit, and a second NMOS transistor of the circuit to float the bit line and the complementary bit line, the first PMOS transistor is coupled between a high voltage node and the bit line, and the second PMOS transistor is coupled between the high voltage node and the complementary bit line, the first NMOS transistor is coupled between a low voltage node and the bit line, and the second NMOS transistor is coupled between the low voltage node and the complementary bit line.

16. The method of claim 15, wherein the memory cell is in a reading operation or in a power down mode.

17. A memory, comprising:
a word line;
a bit line and a complementary bit line;
a memory cell comprising cross-coupled inverters and having a data node coupled to the bit line and a complementary data node coupled to the complementary bit line, wherein the word line controls access to the memory cell; and
a circuit comprising a first PMOS transistor coupled between a high voltage node and the bit line, a second PMOS transistor coupled between the high voltage node and the complementary bit line, a first NMOS transistor coupled between a low voltage node and the bit line, and a second NMOS transistor coupled between the low voltage node and the complementary bit line, wherein the circuit is configured to pull up to a high voltage, pull down to a low voltage, or float the bit line and the complementary bit line based on a first timing of pre-charging and a second timing of write driving, and ending of the first timing of pre-charging and starting of the second timing of write driving is performed simultaneously, and wherein the circuit is configured to turn on the first PMOS transistor and the second PMOS transistor for pre-charging.

* * * * *